US012568724B2

(12) United States Patent
Hsieh et al.

(10) Patent No.: US 12,568,724 B2
(45) Date of Patent: Mar. 3, 2026

(54) DISPLAY DEVICE AND MANUFACTURING METHOD THEREOF

(71) Applicant: Innolux Corporation, Miao-Li County (TW)

(72) Inventors: Tsau-Hua Hsieh, Miao-Li County (TW); Yi-An Chen, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 763 days.

(21) Appl. No.: 17/864,408

(22) Filed: Jul. 14, 2022

(65) Prior Publication Data

US 2023/0047170 A1 Feb. 16, 2023

Related U.S. Application Data

(60) Provisional application No. 63/232,172, filed on Aug. 12, 2021.

(30) Foreign Application Priority Data

May 17, 2022 (CN) .......................... 202210536889.X

(51) Int. Cl.
*H10H 20/855* (2025.01)
*H10H 20/01* (2025.01)

(52) U.S. Cl.
CPC .......... *H10H 20/855* (2025.01); *H10H 20/01* (2025.01); *H10H 20/0363* (2025.01)

(58) Field of Classification Search
CPC ... H01L 25/0753; H01L 25/167; H10H 20/01; H10H 20/0363; H10H 20/855; H10H 20/882
See application file for complete search history.

(56) References Cited

U.S. PATENT DOCUMENTS

| | | | | |
|---|---|---|---|---|
| 2012/0112227 A1* | 5/2012 | Toyama | ............... | H10H 20/856 |
| | | | | 257/E33.072 |
| 2021/0134878 A1 | 5/2021 | Wu et al. | | |
| 2021/0159367 A1* | 5/2021 | Cheng | .................. | H10H 20/856 |
| 2021/0288105 A1* | 9/2021 | Kawanishi | ............... | G09G 3/32 |

FOREIGN PATENT DOCUMENTS

| | | |
|---|---|---|
| CN | 111862788 | 10/2020 |
| CN | 112185268 | 1/2021 |

OTHER PUBLICATIONS

"Office Action of Taiwan Counterpart Application", issued on Nov. 7, 2022, p. 1-p. 6.

* cited by examiner

*Primary Examiner* — Matthew C Landau
*Assistant Examiner* — Dmitriy Yemelyanov
(74) *Attorney, Agent, or Firm* — JCIPRNET

(57) ABSTRACT

The disclosure provides a display device and a manufacturing method thereof. The display device includes a substrate, a spacer layer, a light emitting element, and an optical layer. The spacer layer is disposed on the substrate and includes openings. The light emitting element and the optical layer are disposed in the opening.

20 Claims, 7 Drawing Sheets

DISPLAY DEVICE AND MANUFACTURING METHOD THEREOF

CROSS-REFERENCE TO RELATED APPLICATION

This application claims the priority benefit of U.S. application Ser. No. 63/232,172, filed on Aug. 12, 2021, and China application serial no. 202210536889.X, filed on May 17, 2022. The entirety of the above-mentioned patent application is hereby incorporated by reference herein and made a part of this specification.

BACKGROUND

Technical Field

The disclosure relates to an electronic device and a manufacturing method thereof, and in particular, to a display device and a manufacturing method thereof.

Description of Related Art

Molding or etching processes are often used to process optical layers (e.g. microlens structures). Both methods are complex and neither provides easy control over the profile of the optical layer.

SUMMARY

The disclosure provides a display device and a manufacturing method thereof, which can simplify the manufacturing difficulty of making an optical layer and achieve good optical effects.

According to an embodiment of the disclosure, a display device includes a substrate, a spacer layer, a light emitting element, and an optical layer. The spacer layer is disposed on the substrate and includes an opening. The light emitting element and the optical layer are disposed in the opening.

According to an embodiment of the disclosure, a method of manufacturing a display device includes following steps. A substrates is provided. A spacer layer is formed on the substrate, and the spacer layer includes an opening. A light emitting element is disposed in the opening. An optical layer is formed in the opening.

In order to make the above-mentioned features and advantages of the disclosure more obvious and easy to understand, the following embodiments are given and described in detail in conjunction with the accompanying drawings as follows.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

DESCRIPTION OF THE EMBODIMENTS

Figure 1:
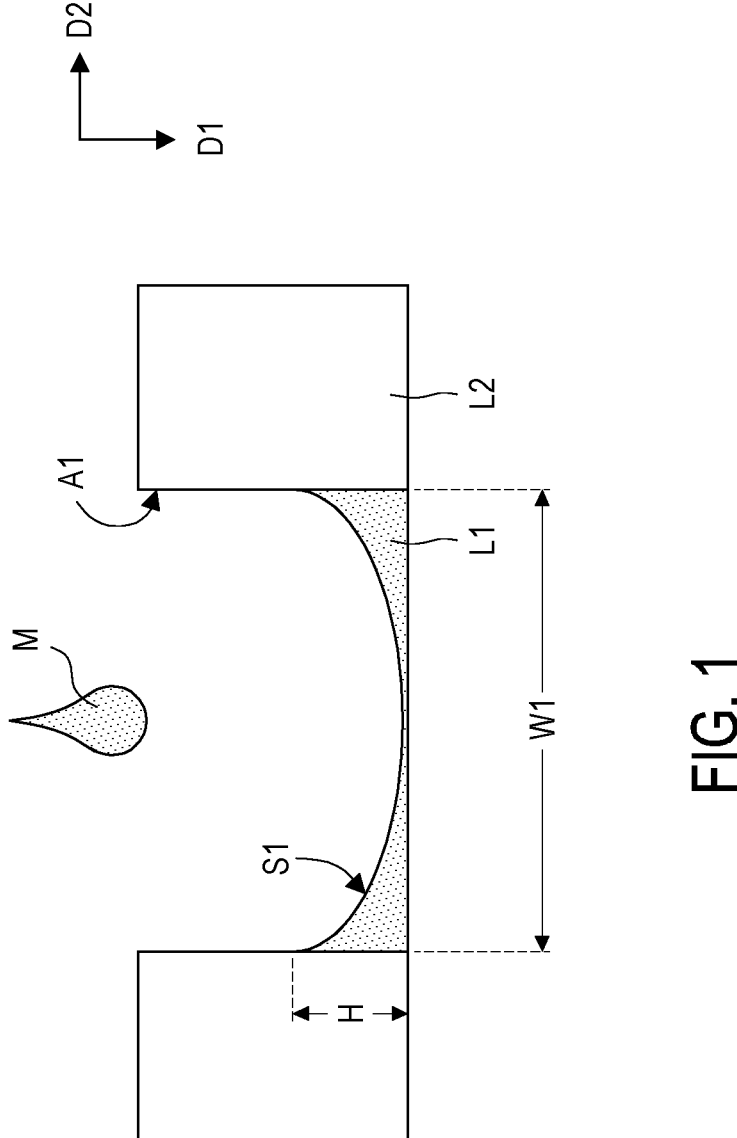
FIG. 1 is a schematic cross-sectional view illustrating a method for making an optical layer.

Reference will now be made in detail to the exemplary embodiments of the disclosure, examples of which are illustrated in the accompanying drawings. Whenever possible, the same reference numbers are used in the drawings and the description to refer to the same or like parts.

Certain terms are used throughout the specification and appended claims of the disclosure to refer to specific components. Those skilled in the art should understand that electronic device manufacturers may refer to the same components by different names. The disclosure does not intend to distinguish between components that have the same function but different names. In the following specification and claims, terms such as "including", "containing", and "having" are open-ended terms, so should be interpreted as meaning "including but not limited to . . . ".

The directional terms mentioned in the disclosure, such as "upper", "lower", "front", "rear", "left", "right" and so on, are used with reference to the accompanying drawings. Therefore, the directional terms used are for illustration, but not to limit, the disclosure. In the accompanying drawings, each drawing shows the general features of the methods, structures and/or materials adopted in a specific embodiment. However, the drawings should not be construed as defining or limiting the scope or nature covered by the embodiments. For example, for clarity, the relative size, thickness, and position of each layer, region, and/or structure may be reduced or enlarged.

When a structure (or layer, component, substrate) is referred to as being located "on/above" another structure (or layer, component, substrate) in the disclosure, it may refer to the two structures being adjacent and directly connected, or it may mean that the two structures are adjacent but not directly connected. "Indirect connection" means that there is at least one intermediary structure (or intermediary layer, intermediary component, intermediary substrate, intermediary spacer) between the two structures, in which the lower surface of a structure is adjacent to or directly connected to the upper surface of the intermediary structure, and the upper surface of the other structure is adjacent to or directly connected to the lower surface of the intermediary structure. The intermediary structure may be a single-layer or multi-layer physical or non-physical structure, and there is no limitation. In the disclosure, when a structure is disposed "on" another structure, it may mean that the structure is "directly" on another structure, or that the structure is "indirectly" on another structure, with at least one structure sandwiched between the two structures.

The terms "equal to", "equivalent", and "same" are generally interpreted as being within 20% of a given value or range, or interpreted as being within 10%, 5%, 3%, 2%, 1%, or 0.5% of a given value or range.

The ordinal numbers used in the specification and claims, such as the terms "first", "second" and the like, to qualify a component do not imply or represent that the component or components are preceded with any ordinal numbers, nor do they represent the order of a certain component and another component, or the order in the manufacturing method, and are used only so as to clearly distinguish a component with one name from another component with the same name. Different terms may be used in the claims and the specification, and accordingly, a first component in the specification may be a second component in the claims.

The electrical connection or coupling described in this disclosure may refer to direct connection or indirect connection. In the case of direct connection, the endpoints of the components on the two circuits are directly connected or are connected to each other by a conductor segment. In the case of indirect connection, between the end points of the components on the two circuits there are switches, diodes, capacitors, inductances, other suitable components, or a combination of the above-mentioned components, but the disclosure is not limited thereto.

In the disclosure, thickness, length, and width may be measured by an optical microscope, and thickness or width may be measured by a cross-sectional image in an electron microscope, but the disclosure is not limited thereto. Moreover, any two values or directions used for comparison may have certain errors. The terms "about", "equal", "equivalent", "identical", "substantially" or "approximately" are generally interpreted as being within 10% of a given value or range. In addition, the terms "a given range is a first value to a second value" and "a given range falls within a range of a first value to a second value" means that the given range includes the first value, the second value, and other values in between. If a first direction is perpendicular to a second direction, the angle between the first direction and the second direction may be between 80 degrees and 100 degrees. If the first direction is parallel to the second direction, the angle between the first direction and the second direction may be between 0 degrees and 10 degrees.

Note that in the following embodiments, the technical features of several different embodiments may be replaced, reorganized, and mixed without departing from the spirit of the disclosure so as to complete other embodiments. The technical features of the embodiments may be mixed and matched arbitrarily as long as they do not violate the spirit of the disclosure or conflict with each other.

Unless otherwise defined, all terms (including technical and scientific terms) used herein have the same meaning as commonly understood by persons having ordinary skill in the art to which the disclosure belongs. It is understood that these terms, such as those defined in commonly used dictionaries, should be interpreted as having meanings consistent with the relevant art and the background or context of the disclosure, and should not be interpreted in an idealized or overly formal way, unless otherwise defined in the embodiments of the disclosure.

The electronic device disclosed in the specification may include a display device, a backlight device, an antenna device, a sensing device, or a tiled device, but is not limited thereto. The electronic device may be a bendable or flexible electronic device. The display device may be a non-self-luminous display device or a self-luminous display device. The electronic device may include, for example, liquid crystal, light emitting diode, fluorescence, phosphor, quantum dot (QD), other suitable display media, or a combination of the foregoing. The antenna device may be a liquid crystal antenna device or a non-liquid crystal antenna device, and the sensing device may be a sensing device for sensing capacitance, light, heat, or ultrasonic waves, but is not limited thereto. In the disclosure, the electronic components may include passive components and active components, such as capacitors, resistors, inductors, diodes, transistors, and the like. The diodes may include light emitting diodes or photodiodes. The light emitting diodes may include, for example, organic light emitting diodes (OLED), sub-millimeter light emitting diodes (mini LED), micro light emitting diodes (micro LED), or quantum dot light emitting diodes (quantum dot LED), but is not limited thereto. The tiled device may be, for example, a display tiled device or an antenna tiled device, but is not limited thereto. It should be noted that the electronic device may be any arrangement and combination of the foregoing, but not limited to thereto. In addition, the appearance of the electronic device may be rectangular, circular, polygonal, a shape with curved edges, or other suitable shapes. An electronic device may have peripheral systems such as a drive system, a control system, a light source system . . . and the like, so as to support a display device, an antenna device, a wearable device (e.g. including augmented reality or virtual reality), an in-vehicle device (e.g. including car windshield), or a tiled device. The display device is used as the electronic device or the tiled device to illustrate the disclosure hereinafter, but the disclosure is not limited thereto.

Note that in the following embodiments, the technical features of several different embodiments may be replaced, reorganized, and mixed without departing from the spirit of the disclosure so as to complete other embodiments.

FIG. 1 is a schematic cross-sectional view illustrating a method for making an optical layer. FIGS. 2 to 7 are partial cross-sectional schematic views of display devices according to various embodiments of the disclosure, respectively.

Referring to FIG. 1, in an embodiment of the disclosure, the method of forming an optical layer L1 may include a printing process. The printing process may include inkjet printing process, but is not limited thereto.

Taking FIG. 1 as an example, a spacer layer L2 may be formed first, and the spacer layer L2 has an opening A1. Next, the optical layer L1 is formed in the opening A1. In some embodiments, the spacer layer L2 and the optical layer L1 may both be formed by the printing process, and the materials of the spacer layer L2 and the optical layer L1 may include polymer materials, solvents, additives, and so on, but are not limited thereto. For example, the polymer material included in the optical layer L1 may be, but not limited to, acrylic resin.

The optical layer L1 having a microlens configuration may be formed in the opening A1 by a specific surface energy phenomenon generated between material M of the optical layer L1 and material of the spacer layer L2. For example, when a contact angle between the material M and the spacer layer L2 is less than 30 degrees, a coffee ring effect will occur, and the microlens configuration shown in FIG. 1 is formed, but the disclosure is not limited thereto. The microlens configuration is, for example, a ring structure, and further, it means that the optical layer L1 has a concave arc-shaped surface S1 and may change a traveling direction of incident light.

By adjusting the contact angle between the optical layer L1 and the spacer layer L2, various parameters of the microlens configuration, such as a maximum height H of the microlens configuration in a top view direction D1 of the display device, a curvature of an arc-shaped surface S, or a shape of the microlens configuration, and so on, may be controlled, but not limited thereto.

The method of adjusting the contact angle between the optical layer L1 and the spacer layer L2 may include adjusting a surface tension of at least one of the optical layer L1 and the spacer layer L2. In some embodiments, the surface tension of the optical layer L1 may be adjusted by changing the solvent and/or additives in the material M of the optical layer L1. In some embodiments, the surface tension of the spacer layer L2 may be adjusted by performing surface treatment on the spacer layer L2. The surface treatment may include applying a plasma of argon mixed with oxygen, plasma of argon mixed with trifluoromethane ($CHF_3$), a plasma of argon mixed with carbon tetrafluoride ($CF_4$), argon plasma, or irradiating with ultraviolet light, and the like, to the surface of the spacer layer L2, but not limited thereto. In some embodiments, the surface tension of the spacer layer L2 may be adjusted by adjusting a ratio of the fluorine-containing additive in the material of the spacer layer L2.

The optical layer L1 having the microlens configuration is formed by the surface energy phenomenon of the printing process, so as to simplify the difficulty of making the optical layer L1. In some embodiments, although not shown, the optical layer L1 may include scattering particles, metal particles, or a combination of the two so as to enhance the reflectivity or light-collecting effect of the optical layer L1. The material of the scattering particles may include, but is not limited to, titanium dioxide. The material of the metal particles may include, but not limited to, silver, gold, or aluminum. The optical layers of the following embodiments may also include scattering particles, metal particles or a combination of the two, which will not be repeated hereinafter.

Figure 2:
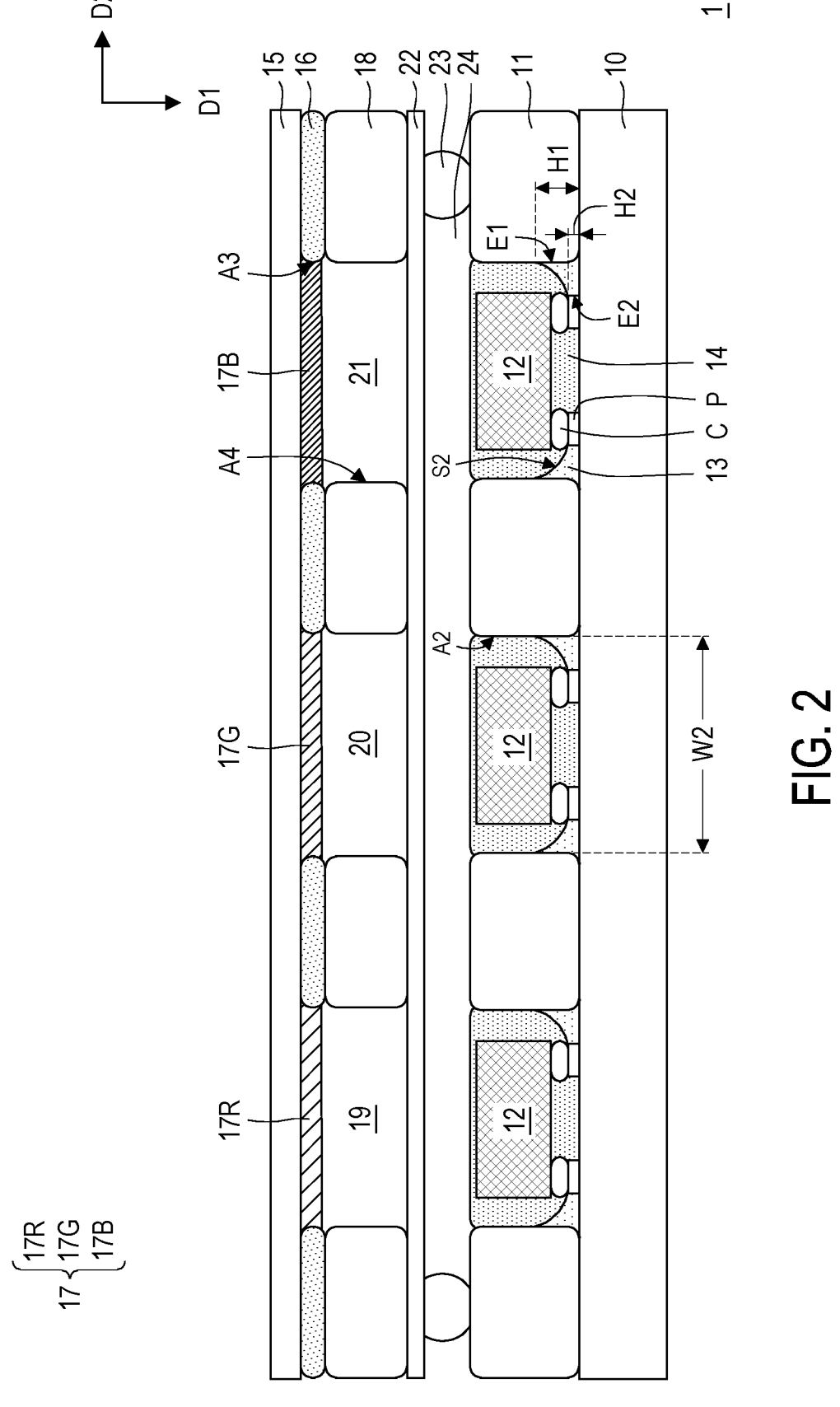
FIGS. 2 to 7 are partial cross-sectional schematic views of display devices according to various embodiments of the disclosure, respectively.

Referring to FIG. 2, a display device 1 includes a substrate 10, a spacer layer 11, light emitting elements 12, and optical layers 13. The spacer layer 11 is disposed on the substrate 10 and includes openings A2. The light emitting element 12 and the optical layer 13 are disposed in the opening A2.

In detail, the substrate 10 may be an array substrate. Although not shown, the array substrate may include a carrier board, a driving element, a common electrode, a dielectric layer, and so on, but is not limited thereto. The carrier board may be a rigid substrate or a flexible substrate. The material of the carrier board includes, for example, but not limited to, silicon (e.g. polysilicon), glass, quartz, ceramic, sapphire, or plastic. The driving elements may include a transistor. The transistor may include a gate electrode, a semiconductor layer, a source electrode, a drain electrode, and so on, but is not limited thereto. The material of the semiconductor layer may include amorphous silicon, polysilicon, metal oxide, or a combination thereof. The metal oxide may include, but not limited to, Indium Gallium Zinc Oxide (IGZO).

The spacer layer 11 is, for example, a pixel define layer, and the spacer layer 11 may be formed on the substrate 10 by the above-mentioned methods (e.g. printing process). For the details of the spacer layer 11, reference may be made to the above description related to the spacer layer L2, which will not be repeated herein.

The light emitting element 12 is disposed above the substrate 10 and located in the opening A2. In some embodiments, the light emitting element 12 may be fixed on pads P of the substrate 10 through conductive members C and is electrically connected to the pads P. In some embodiments, the material of the pad P may include copper, aluminum, other conductive materials, or a combination thereof, but is not limited thereto. In some embodiments, the material of the pad P may include electroless nickel immersion gold (ENIG), electroless nickel electroless palladium immersion gold (ENEPIG), immersion silver, electrolytic gold, or electrolytic nickel, but not limited thereto. The material of the conductive member C may include tin, copper paste, other metal materials, or anisotropic conductive film (ACF), but is not limited thereto.

The light emitting element 12 is configured to provide a light beam (not shown). The light emitting element 12 may include a light emitting diode (LED), an organic light emitting diode (OLED), a sub-millimeter light emitting diode (mini LED), a micro light emitting diode (micro LED), or a quantum dot light emitting diode (quantum dot diode, abbreviated as QLED or QD-LED). In some embodiments, the light emitting element 12 is a bare die, and each surface of the light emitting element 12 may emit light.

In some embodiments, the display device 1 includes a plurality of light emitting elements 12, and the plurality of light emitting elements 12 are respectively disposed in a plurality of openings A2. In some embodiments, the plurality of light emitting elements 12 may all be blue light emitting elements emitting blue light, but not limited thereto.

The optical layer 13 is disposed on the substrate 10 and located in the opening A2. The optical layer 13 may be formed on the substrate 10 by the above-mentioned methods (e.g. printing process). For the details of the optical layer 13, reference may be made to the above description related to the optical layer L1, which will not be repeated herein.

The manufacturing method of the display device 1 includes, for example, following steps. The substrate 10 is provided. The spacer layer 11 is formed on the substrate 10, and the spacer layer 11 includes the openings A2. The light emitting element 12 is disposed in the opening A2. The optical layer 13 is formed in the opening A2.

In some embodiments, the light emitting element 12 may be disposed in the opening A2 first, and then the optical layer 13 may be formed. In other embodiments, the optical layer 13 may be formed in the opening A2 first, and then the light emitting element 12 may be disposed.

The optical layer 13 is located or formed in the opening A2, or further located or formed between the light emitting element 12 and the spacer layer 11. A size of the opening A2 in FIG. 2 (e.g. a width W2 in a direction D2) may be larger than a size of the opening A1 in FIG. 1 (e.g. a width W1 in the direction D2), so as to facilitate the disposition of the light emitting element 12. Since the width W2 of the opening A2 in the direction D2 is larger, viewed from the top view direction D1 of the display device 1, the optical layer 13 may be disconnected at the middle of the opening A2, for example, and further form a ring structure including the disconnected portion. The optical layer 13 has, for example, a concave arc-shaped surface S2. In some embodiments, the concave arc-shaped surface S2 may be discontinuous, for example, but not limited thereto. The arc-shaped surface S2 connects one side (such as a first side E1) of the optical layer 13 adjacent to the spacer layer 11 and the other side of the optical layer 13 adjacent to the light emitting element 12 (such as a second side E2). A height H1 of the one side (e.g. the first side E1) of the optical layer 13 adjacent to the spacer layer 11 is larger than a height H2 of the other side (e.g. the second side E2) adjacent to the light emitting element 12.

Through the arc-shaped surface S2 of the optical layer 13, light emitted from the light emitting element 12 (e.g. light emitted from multiple sides of the light emitting element 12) may be concentrated and transmitted upward, thereby improving the light emission efficiency.

According to different requirements, the display device 1 may further include other elements and/or film layers. For example, the display device 1 may further include an adhesive material 14, and the adhesive material 14 is filled in the opening A2 to fix the light emitting element 12. In some embodiments, the optical layer 13 is formed before filling the adhesive material 14, and the optical layer 13 is covered by the adhesive material 14 and is located between the adhesive material 14 and the substrate 10. In some embodiments, the adhesive material 14 may include an underfill, and part of the adhesive material 14 may be filled between the light emitting element 12 and the substrate 10 so as to reduce the influence of thermal stress or physical stress on the light emitting element 12 or to improve strengthen the connection between the light emitting element 12 and the pads P.

In some embodiments, a refractive index of the adhesive material 14 is larger than a refractive index of the optical layer 13. For example, the difference in the refractive index between the adhesive material 14 and the optical layer 13 is at least larger than 0.05, such that the light may be transmitted upwardly through total internal reflection (TIR) at the interface between the adhesive material 14 and the optical layer 13, thereby improving light emission efficiency.

In some embodiments, the display device 1 may further include a substrate 15, a light absorption layer 16, a color filter 17, a spacer layer 18, a color conversion pattern 19, a color conversion pattern 20, a light scattering layer 21, an encapsulation layer 22, a spacer 23, and an adhesive layer 24, but not not limited thereto.

The substrate 15 is opposite to the substrate 10. The substrate 15 may be a rigid substrate or a flexible substrate. The material of the substrate 15 includes, for example, glass, quartz, ceramic, sapphire or plastic, but not limited thereto. In some embodiments, the substrate 15 may be a flexible substrate, and the material of the substrate 15 may include polycarbonate (PC), polyimide (PI), polypropylene (PP), polyethylene terephthalate (PET), other suitable flexible materials, or a combination of the foregoing materials, but not limited thereto.

The light absorption layer 16 is disposed on a surface of the substrate 15 facing the substrate 10 and overlaps the spacer layer 11 in the top view direction D1 of the display device. The material of the light absorption layer 16 may be any material capable of absorbing light, such as a black matrix, but not limited thereto. The light absorption layer 16 has openings A3.

The color filter 17 overlaps with the light emitting element 12 in the top view direction D1 of the display device, and the color filter 17 may include a plurality of filter patterns, such as a red filter pattern 17R that allows red light to pass and filters the remaining colors, a green filter pattern 17G that allows green light to pass and filters the remaining colors, and a blue filter pattern 17B that allows blue light to pass and filters other colors, but not limited thereto. A plurality of filter patterns are respectively disposed in a plurality of openings A3.

The spacer layer 18 is disposed on the surface of the light absorption layer 16 facing the substrate 10. The spacer layer 18 may be a polymer material that absorbs or reflects visible light wavelengths. For example, the material of the spacer layer 18 may include titanium dioxide (TiO2), carbon black, tilox black, siloxane, acrylic with black dye, other suitable materials or the above combination, but not limited to this. Moreover, the composition of the spacer layer 18 may be adjusted to the mixing ratio of different materials according to requirements, such that the spacer layer 18 may be formed in a state including white, gray, or black, but not limited thereto. In some embodiments, the material of the spacer layer 11 may be the same as the material contained in the spacer layer 18, which will not be repeated herein. The spacer layer 18 has openings A4. The opening A4 overlaps the opening A3 in the top view direction D1 of the display device.

The color conversion pattern 19, the color conversion pattern 20, and the light scattering layer 21 are respectively disposed in a plurality of openings A4. The color conversion pattern 19 and the color conversion pattern 20 may include wavelength conversion materials such as fluorescence, phosphorescence, quantum dots (QDs), other suitable materials capable of converting the color of light, or a combination thereof, but not limited to this. In some embodiments, the color conversion pattern 19 includes, for example, a wavelength conversion material that converts blue light to red light; the color conversion pattern 20 includes, for example, a wavelength conversion material that converts blue light to green light; and the light scattering layer 21 includes, for example, light scattering particles, but not limited thereto.

The encapsulation layer 22 is disposed on surfaces of the spacer layer 18, the color conversion pattern 19, the color conversion pattern 20, and the light scattering layer 21 facing the substrate 10. In some embodiments, the encapsulation layer 22 may include a transparent material, a water and oxygen blocking material, other suitable materials, or a combination thereof, but is not limited thereto. For example, the material of the encapsulation layer 22 may include epoxy, acrylic-based resin, silicone, polyimide polymer, or a combination thereof, but not limited thereto. In some embodiments, the water and oxygen blocking material may include silicon oxide, silicon nitride, silicon oxynitride, or a combination thereof, but is not limited thereto. In some embodiments, the encapsulation layer 22 may include a bandpass filter or an optical stack formed by alternately stacking multiple layers of high and low refractive indices, so as to reflect red light and green light and allow blue light to pass through, thereby improving light emission efficiency. In some embodiments, the encapsulation layer 22 may be a stacked layer of the above-mentioned various functional layers.

The spacer 23 is disposed between the encapsulation layer 22 and the spacer layer 11, and the spacer 23 may be configured to seal the adhesive layer 24. The adhesive layer 24 may be optically clear adhesive (OCA) or optically clear resin (OCR), but not limited thereto.

Figure 3:
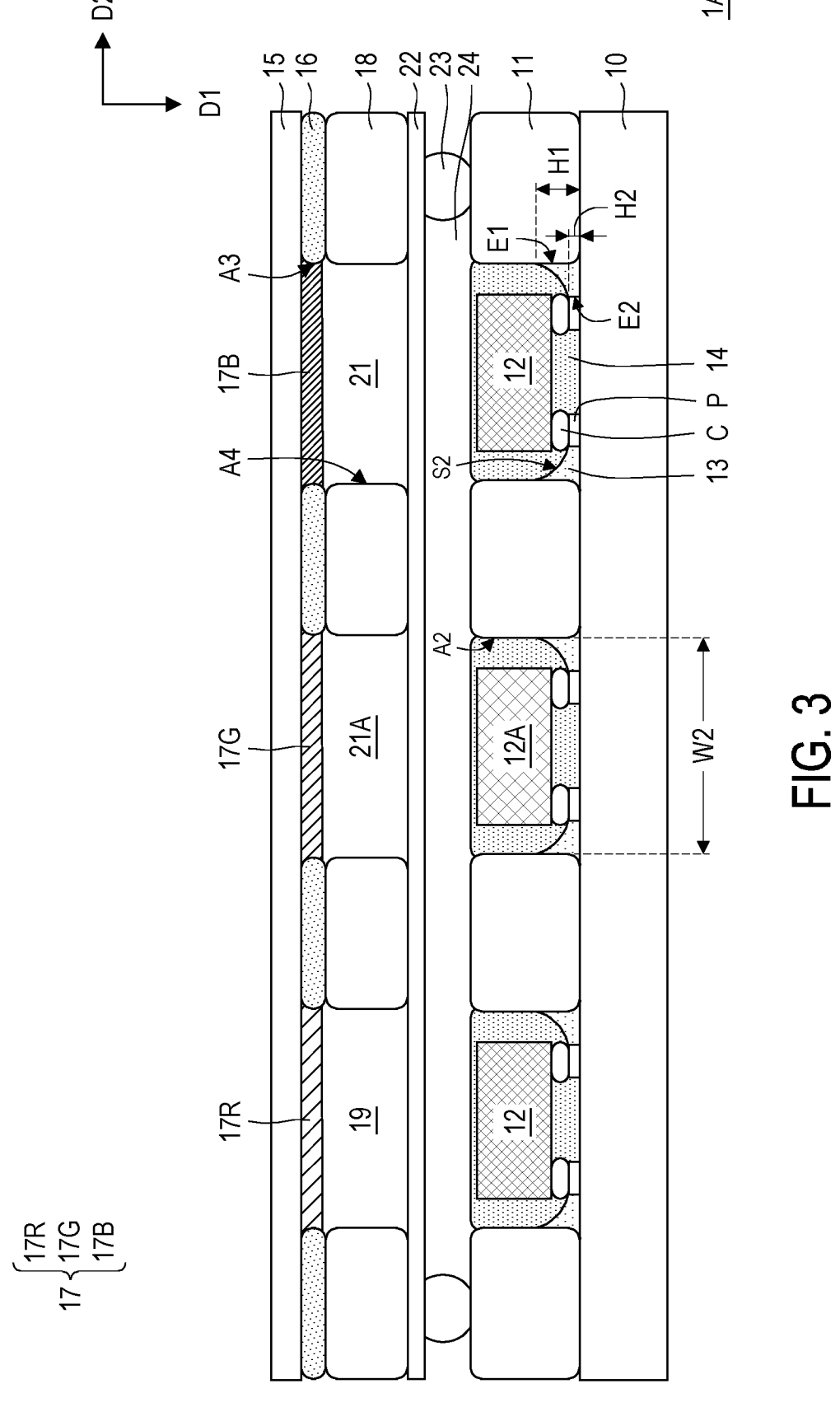

Referring to FIG. 3, the main differences between a display device 1A and the display device 1 of FIG. 2 are described as follows. In the display device 1A, the light emitting element overlapping the green filter pattern 17G in the top view direction D1 of the display device is replaced from the light emitting element 12 in FIG. 2 to a light emitting element 12A in FIG. 3. The light emitting element 12A and the light emitting element 12 emit light of different colors. For example, the light emitting element 12A emits green light, while the light emitting element 12 emits blue light. Moreover, the color conversion pattern 20 in FIG. 2 is replaced with a light scattering layer 21A. The light scattering layer 21A includes, for example, but not limited to, light scattering particles.

Figure 4:
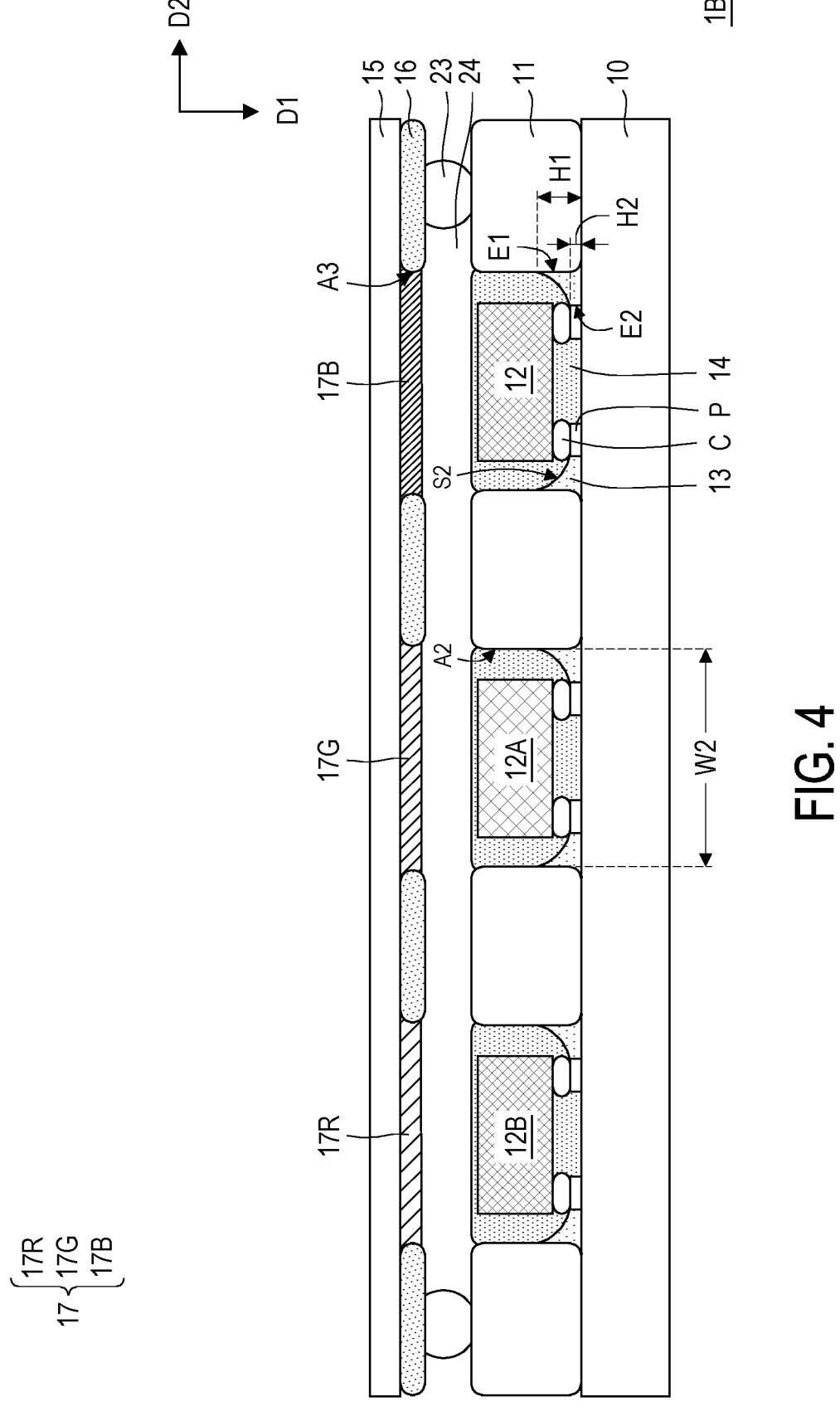

Referring to FIG. 4, the main differences between a display device 1B and the display device 1A of FIG. 3 are described as follows. In the display device 1B, the light emitting element overlapping the red filter pattern 17R in the top view direction D1 of the display device is replaced from the light emitting element 12 in FIG. 3 to a light emitting element 12B in FIG. 4. The light emitting element 12B, the light emitting element 12A, and the light emitting element 12 emit light of different colors. For example, the light emitting element 12B emits red light, the light emitting element 12A emits green light, and the light emitting element 12 emits blue light. Moreover, the display device 1B may omit, for example, the spacer layer 18, the color conversion pattern 19, the light scattering layer 21, the light scattering layer 21A, and the encapsulation layer 22 in FIG. 3, but is not limited thereto.

Figure 5:
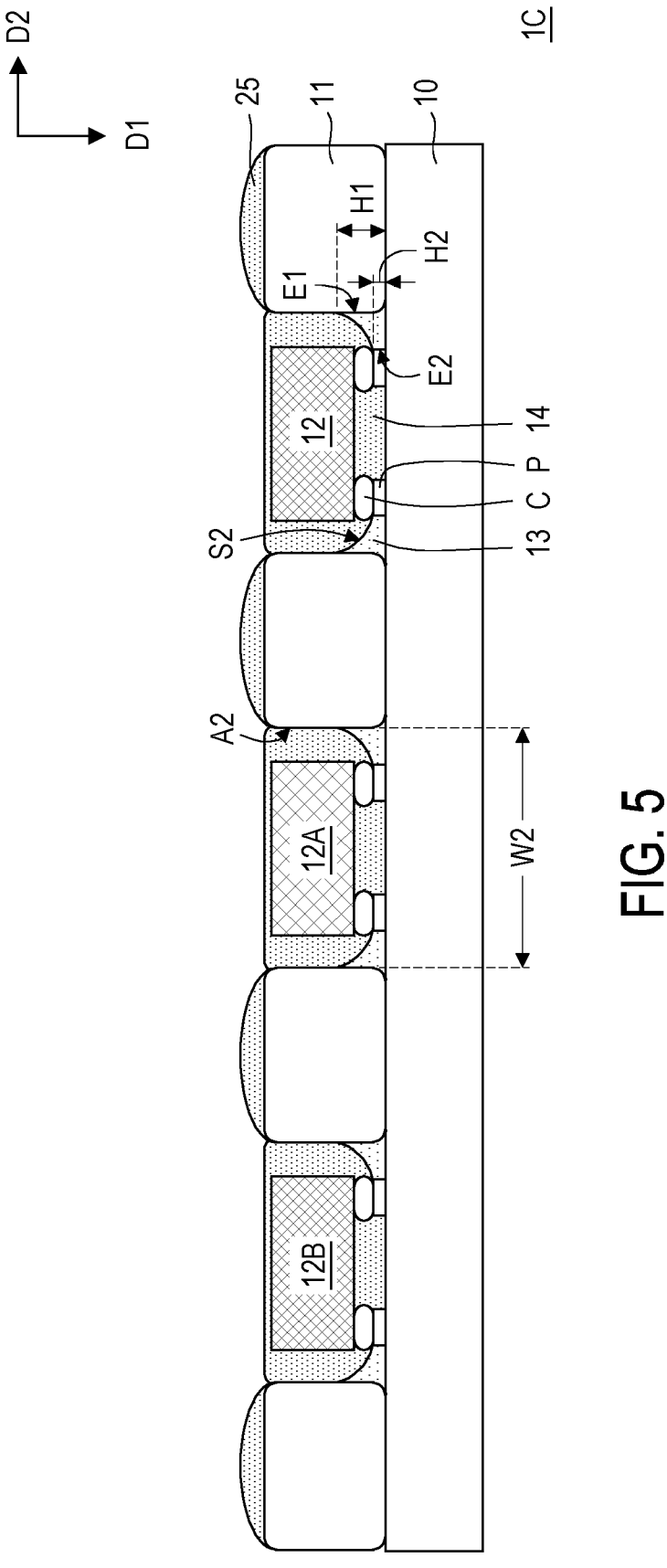

Referring to FIG. 5, the main differences between a display device 1C and the display device 1B of FIG. 4 are described as follows. For example, the display device 1C may omit the substrate 15, the light absorption layer 16, the color filter 17, the spacer 23 and the adhesive layer 24 in FIG. 4. In addition, the display device 1C may further include a light absorption layer 25. The light absorption layer 25 is disposed on the spacer layer 11 and overlaps with the spacer layer 11 in the top view direction D1 of the display device.

The light absorption layer 25 may be configured to absorb ambient light or reduce the reflection of ambient light, thereby increasing the contrast of the display device 1C. For example, the material of the light absorption layer 25 may be any material capable of absorbing light, such as a black matrix, but not limited thereto. In some embodiments, the light absorption layer 25 may be formed on the spacer layer 11 by printing process, but not limited thereto.

Figure 6:
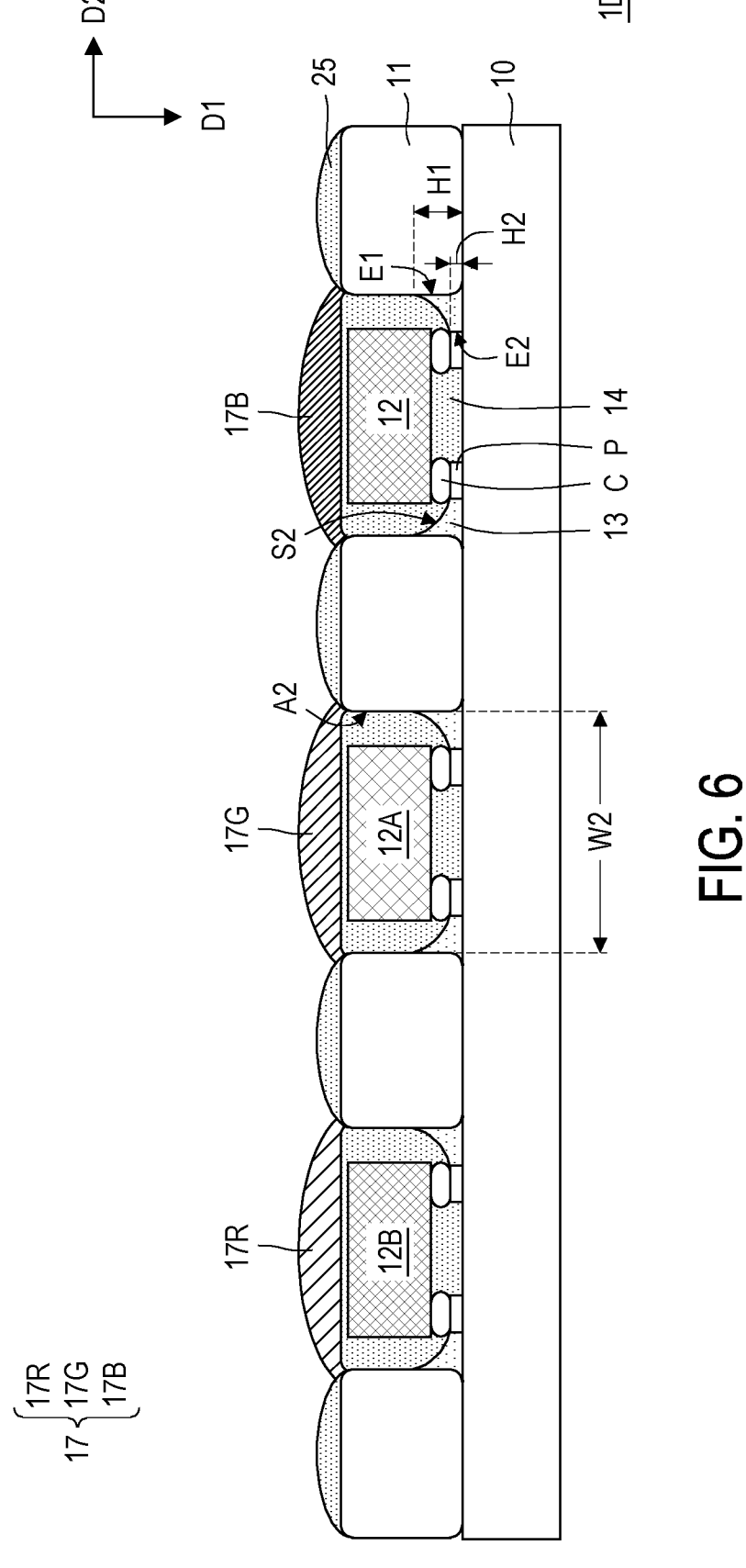

Referring to FIG. 6, the main differences between a display device 1D and the display device 1C of FIG. 5 are described as follows. The display device 1D may further include the color filter 17 so as to increase color purity. The red filter pattern 17R, the green filter pattern 17G, and the blue filter pattern 17B of the color filter 17 are disposed on the adhesive material 14 and overlap with the light emitting element 12B, the light emitting element 12A, and the light emitting element 12 respectively in the top view direction D1 of the display device.

Figure 7:
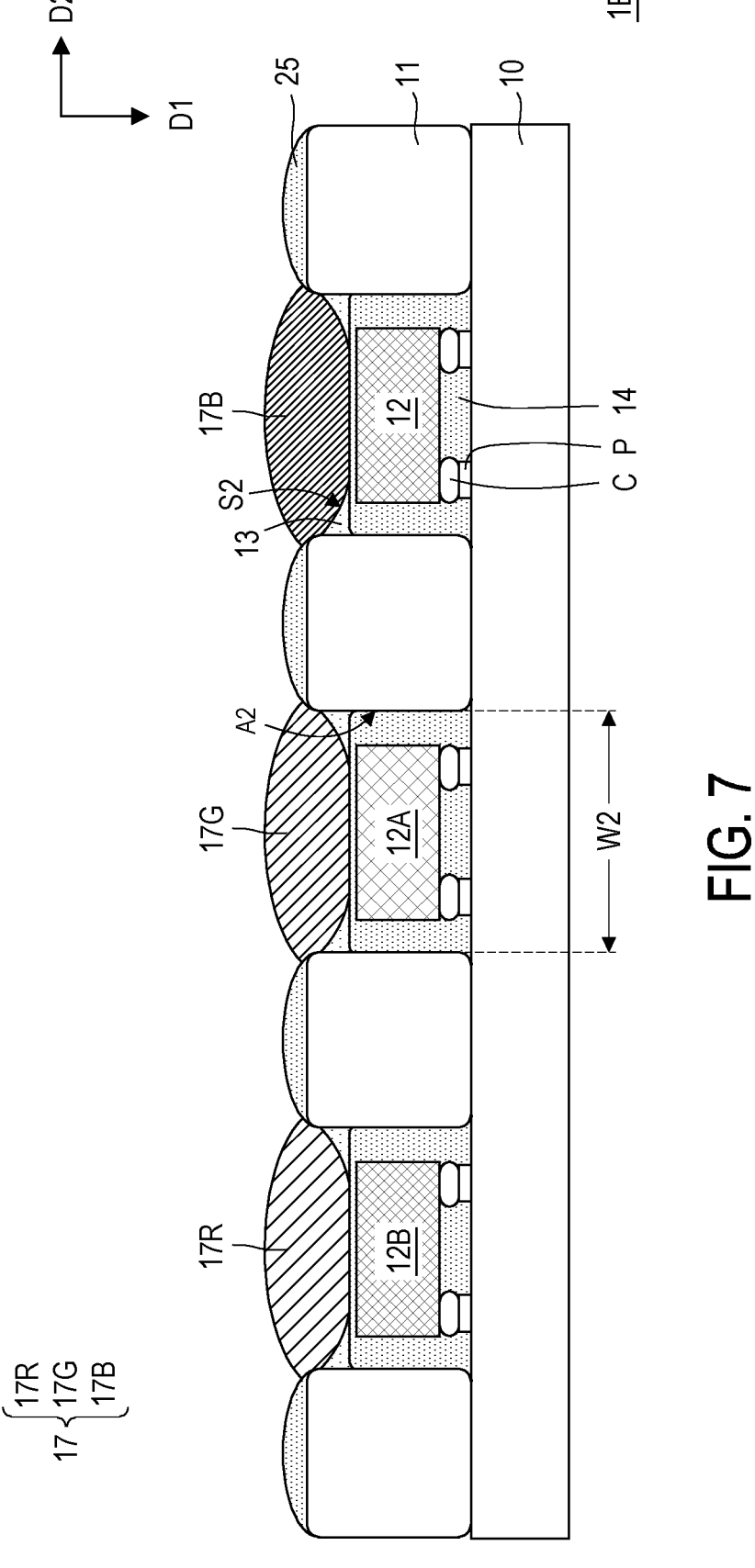

Referring to FIG. 7, the main differences between a display device 1E and the display device 1B of FIG. 4 are described as follows. In the display device 1E, the optical layer 13 is located/formed on the light emitting element 12. For example, the optical layer 13 is formed after filling the adhesive material 14, such that the optical layer 13 is located/formed on the light emitting element 12 and the adhesive material 14. In some embodiments, a top surface of the adhesive material 14 may be as high as a top surface of the light emitting element 12 or lower than the top surface of the light emitting element 12, but is not limited thereto. In some embodiments, the adhesive material 14 has high transmittance and thus may completely cover the top surface of the light emitting element 12. Moreover, the red filter pattern 17R, the green filter pattern 17G and the blue filter pattern 17B of the color filter 17 may be formed on the light emitting element 12B, the light emitting element 12A, and the light emitting element 12, respectively, such that the optical layer 13 is located between the red filter pattern 17R and the light emitting element 12B, between the green filter pattern 17G and the light emitting element 12A, or between the blue filter pattern 17B and the light emitting element 12. Moreover, the refractive index of the color filter 17 (including the red filter pattern 17R, the green filter pattern 17G, and the blue filter pattern 17B) is, for example, larger than the refractive index of the optical layer 13. For example, the difference in the refractive index between the color filter 17 and the optical layer 13 may be at least larger than 0.05 so as to facilitate light emission.

In summary, in the embodiments of the disclosure, an optical layer having a microlens configuration may be formed by the surface energy phenomenon of the printing process, so as to simplify the difficulty of making the optical layer, thereby achieving good optical effects.

Finally, it should be noted that the above embodiments are used only to illustrate the technical solution of the disclosure, but not to limit the same. Although the disclosure is described in detail with reference to the above embodiments, those skilled in the art should understand that: the technical solutions described in the above embodiments may still be modified, and some or all of the technical features may be replaced equivalently; and such modifications or replacements do not depart from the scope of the technical solutions described by the embodiments of the disclosure.

Although the embodiments of the disclosure and their advantages have been disclosed as above, it should be understood that any person having ordinary knowledge in the technical field can make changes, substitutions and modifications without departing from the spirit and scope of the disclosure, and the features of each embodiment can be arbitrarily mixed and replaced with each other to form other new embodiments. Moreover, the protection scope of the disclosure is not limited to the process, machine, manufacture, material composition, device, method and steps in the specific embodiments described in the specification; anyone with ordinary knowledge in the art can understand the present or future developed processes, machines, manufactures, compositions, devices, methods and steps from the disclosure, and anything that can perform substantially the same functions or achieve substantially the same results in the embodiments described herein can be used in accordance with the disclosure. Therefore, the protection scope of the disclosure includes the above-mentioned processes, machines, manufactures, material compositions, devices, methods and steps. In addition, each claim constitutes a separate embodiment, and the scope of the disclosure also includes combinations of each claim and the embodiment. The scope of protection of the disclosure shall be defined by the appended claims.

What is claimed is:

1. A display device, comprising:
a substrate;
a spacer layer, disposed on the substrate and having a first opening and a second opening;
a first light emitting element, disposed in the first opening;
a second light emitting element, disposed in the second opening;
a color filter, comprising a first filter pattern and a second filter pattern, wherein the first filter pattern and the second filter pattern respectively overlap the first light emitting element and the second light emitting element in a top view direction of the display device; and
an optical layer, disposed in the first opening and the second opening, wherein:
the first light emitting element and the second light emitting element emit light of different colors,
the first light emitting element and the first filter pattern are of a same color, and
the second light emitting element and the second filter pattern are of a same color.

2. The display device according to claim 1, wherein the optical layer is located between the first light emitting element and the spacer layer and between the second light emitting element and the spacer layer.

3. The display device according to claim 1, wherein the optical layer is located on the first light emitting element and the second light emitting element.

4. The display device according to claim 1, further comprising:
an adhesive material disposed in the first opening and the second opening, wherein a refractive index of the adhesive material is larger than a refractive index of the optical layer.

5. The display device according to claim 1, wherein a height of one side of the optical layer adjacent to the spacer layer is larger than a height of the other side of the optical layer adjacent to the first light emitting element or the second light emitting element.

6. The display device according to claim 1, wherein the optical layer has a concave arc-shaped surface.

7. The display device according to claim 4, wherein a difference in the refractive index between the adhesive material and the optical layer is at least larger than 0.05.

8. The display device according to claim 1, further comprising:

a light absorption layer, overlapping the spacer layer in the top view direction of the display device.

9. The display device according to claim 1, wherein the optical layer comprises scattering particles.

10. The display device according to claim 1, wherein the optical layer comprises metal particles.

11. A manufacturing method of a display device, the method comprising:

providing a substrate;

forming a spacer layer on the substrate, the spacer layer having a first opening and a second opening;

disposing a first light emitting element in the first opening;

disposing a second light emitting element in the second opening;

forming a color filter, the color filter comprising a first filter pattern and a second filter pattern, wherein the first filter pattern and the second filter pattern respectively overlap the first light emitting element and the second light emitting element in a top view direction of the display device; and forming an optical layer in the first opening and the second opening, wherein:

the first light emitting element and the second light emitting element emit light of different colors, the first light emitting element and the first filter pattern are of a same color, and the second light emitting element and the second filter pattern are of a same color.

12. The manufacturing method of a display device according to claim 11, wherein the optical layer is formed between the first light emitting element and the spacer layer and between the second light emitting element and the spacer layer.

13. The manufacturing method of a display device according to claim 11, wherein the optical layer is formed on the first light emitting element and the second light emitting element.

14. The manufacturing method of a display device according to claim 11, wherein the optical layer is formed in the first opening and the second opening by a printing process.

15. The manufacturing method of a display device according to claim 14, wherein the printing process is an inkjet printing process.

16. The manufacturing method of a display device according to claim 11, further comprising:

filling an adhesive material in the first opening and the second opening to fix the first light emitting element and the second light emitting element.

17. The manufacturing method of a display device according to claim 16, wherein the optical layer is formed before filling the adhesive material.

18. The manufacturing method of a display device according to claim 16, wherein the optical layer is formed after filling the adhesive material.

19. The manufacturing method of a display device according to claim 16, a wherein the color filter is formed on the adhesive material.

20. The manufacturing method of a display device according to claim 11, further comprising:

forming a light absorption layer on the spacer layer.

* * * * *